(12) United States Patent
Ai et al.

(10) Patent No.: US 12,482,710 B2
(45) Date of Patent: Nov. 25, 2025

(54) METHOD OF FABRICATING ARRAY SUBSTRATE WITH TESTING PINS

(71) Applicants: Hefei Xinsheng Optoelectronics Technology Co., Ltd., Anhui (CN); BOE Technology Group Co., Ltd., Beijing (CN)

(72) Inventors: Yu Ai, Beijing (CN); Xuewu Xie, Beijing (CN); Bowen Liu, Beijing (CN); Yubao Kong, Beijing (CN); Shi Sun, Beijing (CN); Hao Liu, Beijing (CN); Ameng Zhang, Beijing (CN)

(73) Assignees: Hefei Xiasheng Optoelectronics Technology Co., Ltd., Anhui (CN); Beijing BOE Technology Development Co., Ltd., Beijing (CN)

( * ) Notice: Subject to any disclaimer, the term of this patent is extended or adjusted under 35 U.S.C. 154(b) by 965 days.

(21) Appl. No.: 17/417,050

(22) PCT Filed: Sep. 9, 2020

(86) PCT No.: PCT/CN2020/114189
§ 371 (c)(1),
(2) Date: Jun. 21, 2021

(87) PCT Pub. No.: WO2022/051929
PCT Pub. Date: Mar. 17, 2022

(65) Prior Publication Data
US 2022/0319937 A1 Oct. 6, 2022

(51) Int. Cl.
*H01L 21/66* (2006.01)
*H01L 21/67* (2006.01)
(Continued)

(52) U.S. Cl.
CPC ........ *H01L 22/34* (2013.01); *H01L 21/67288* (2013.01); *H01L 22/14* (2013.01);
(Continued)

(58) Field of Classification Search
CPC ...................................... H01L 22/34
See application file for complete search history.

(56) References Cited

U.S. PATENT DOCUMENTS 9,276,019 B2 * 3/2016 Yamada .................. H01L 22/32
2002/0084460 A1 * 7/2002 Takizawa ............. H10D 86/443
438/149
(Continued)

FOREIGN PATENT DOCUMENTS

CN  114121705 A  *  3/2022
KR  20070047097 A  *  5/2007
KR  20090043749 A  *  5/2009

*Primary Examiner* — Peter Bradford
(74) *Attorney, Agent, or Firm* — Intellectual Valley Law, P.C.

(57) ABSTRACT

A method of fabricating an array substrate is provided. The method includes providing a substrate including a gate pad configured to bond a gate driving integrated circuit, a data pad configured to bond a data driving integrated circuit, and a plurality of peripheral layout gate (PLG) proto-lines connecting the gate pad and the data pad; forming a PLG testing pad on the substrate; forming a shorting bar connecting the PLG testing pad to first terminals of the plurality of PLG proto-lines; forming a plurality of testing pins respectively connected to second terminals of the plurality of PLG proto-lines, wherein the plurality of testing pins are formed in a first dummy region of the substrate, the first dummy region is adjacent to an array substrate region of the substrate; and connecting the plurality of testing pins to a probe unit to test connectivity of the plurality of PLG proto-lines.

16 Claims, 9 Drawing Sheets

(51) Int. Cl.
*H01L 27/12* (2006.01)
*H10D 86/01* (2025.01)
*H10D 86/40* (2025.01)
*H10D 86/60* (2025.01)

(52) U.S. Cl.
CPC ......... *H10D 86/021* (2025.01); *H10D 86/441* (2025.01); *H10D 86/60* (2025.01)

(56) References Cited

U.S. PATENT DOCUMENTS

| | | | |
|---|---|---|---|
| 2003/0193623 A1* | 10/2003 | Lim | G02F 1/136286 |
| | | | 349/40 |
| 2007/0018680 A1* | 1/2007 | Jeon | G09G 3/006 |
| | | | 324/760.02 |
| 2007/0046336 A1* | 3/2007 | Kang | G02F 1/1345 |
| | | | 326/101 |
| 2009/0284706 A1* | 11/2009 | Liu | G02F 1/1362 |
| | | | 349/149 |
| 2015/0108480 A1* | 4/2015 | Xu | H01L 22/22 |
| | | | 438/4 |
| 2015/0170982 A1* | 6/2015 | Jeong | G09G 3/006 |
| | | | 257/48 |
| 2016/0357041 A1* | 12/2016 | Jiang | G02F 1/136286 |
| 2020/0074955 A1* | 3/2020 | Fujikawa | G02F 1/1345 |

* cited by examiner

METHOD OF FABRICATING ARRAY SUBSTRATE WITH TESTING PINS

CROSS-REFERENCE TO RELATED APPLICATION

This application is a national stage application under 35 U.S.C. § 371 of International Application No. PCT/CN2020/114189, filed Sep. 9, 2020, the contents of which are incorporated by reference in the entirety.

TECHNICAL FIELD

The present invention relates to display technology, more particularly, to a method of fabricating an array substrate, an array substrate, a display apparatus, and a probe unit.

BACKGROUND

Typically, a mother substrate is fabricated to include multiple array substrate regions, and the mother substrate is then cut into multiple array substrates. Prior to cutting the mother substrate, the connectivity of gate lines and data lines are tested. To test connectivity of gate lines and data lines in a substrate, a probe unit can be used to load signals to lead regions of substrate pads. Multiple probe blocks can correspond to multiple lead regions of the substrate respectively. Testing electrodes contacting with the probe block can be connected to the gate lines and data lines on the array substrate through testing lines, so that the testing electrodes can transmit testing signals from or to the gate lines and data lines.

SUMMARY

In one aspect, the present disclosure provides a method of fabricating an array substrate, comprising providing a substrate comprising a gate pad configured to bond a gate driving integrated circuit, a data pad configured to bond a data driving integrated circuit, and a plurality of peripheral layout gate (PLG) proto-lines connecting the gate pad and the data pad; forming a PLG testing pad on the substrate; forming a shorting bar connecting the PLG testing pad to first terminals of the plurality of PLG proto-lines; forming a plurality of testing pins respectively connected to second terminals of the plurality of PLG proto-lines, wherein the plurality of testing pins are formed in a first dummy region of the substrate, the first dummy region is adjacent to an array substrate region of the substrate; and connecting the plurality of testing pins to a probe unit to test connectivity of the plurality of PLG proto-lines.

Optionally, prior to providing the substrate, the method further comprises forming a plurality of additional pads between the data pad and the gate pad; wherein a respective one of the plurality of PLG proto-lines is formed to extend from a respective first terminal to a respective second terminal connecting to a respective one of the plurality of testing pins; and the respective one of the plurality of PLG proto-lines comprises a first portion and a second portion respectively in the array substrate region and respectively on two sides of a respective one of the plurality of additional pads, and a connecting portion connecting the first portion and the second portion, the connecting portion being in the first dummy region.

Optionally, connecting the plurality of testing pins to the probe unit comprises connecting the plurality of testing pins to a printing circuit board of the probe unit through a probe block of the probe unit thereby electrically connecting N number of the plurality of testing pins respectively to gate electrodes of N number of a plurality of transistors connected in series in the printing circuit board; wherein a first test pin of the N number of the plurality of testing pins is also electrically connected to a source electrode of a first transistor of the N number of the plurality of transistors; a drain electrode of a last transistor of the N number of the plurality of transistors is electrically connected to a light emitting element of the printing circuit board; a source electrode of an n-th transistor between the first transistor and the last transistor is connected to a drain electrode of a (n−1)-th transistor, 1<n<N; a drain electrode of the n-th transistor is connected to a source electrode of a (n+1)-th transistor.

Optionally, the method further comprises providing a testing voltage signal to the PLG testing pad; wherein, upon providing the testing voltage signal to the PLG testing pad, the light emitting element in a turning-off state indicates connectivity in at least one of the plurality of PLG proto-lines is compromised.

Optionally, the method further comprises providing a testing voltage signal to the PLG testing pad; wherein, upon providing the testing voltage signal to the PLG testing pad, the light emitting element in a turning-on state indicates connectivity in each of the plurality of PLG proto-lines is intact.

Optionally, the method further comprises, based upon the light emitting element being in the turning-on state, cutting the substrate to form an array substrate; wherein the plurality of PLG proto-lines are cut to form a plurality of PLG lines, the plurality of PLG lines are configured to transmit signals between the gate driving integrated circuit and the data driving integrated circuit in a display apparatus having the array substrate, the gate driving integrated circuit bonded to the gate pad, and the data driving integrated circuit bonded to the data pad.

Optionally, prior to providing the substrate, the method further comprises forming a plurality of additional pads between the data pad and the gate pad; wherein a respective one of the plurality of PLG proto-lines is formed to extend from a respective first terminal to a respective second terminal connecting to a respective one of the plurality of testing pins; and the respective one of the plurality of PLG proto-lines comprises a first portion and a second portion respectively in the array substrate region and respectively on two sides of a respective one of the plurality of additional pads, and a connecting portion connecting the first portion and the second portion, the connecting portion being in the first dummy region; and the respective one of the plurality of PLG proto-lines is cut along a first cutting line thereby removing the connecting portion.

Optionally, the plurality of PLG proto-lines are cut along a first cutting line between the first dummy region and the array substrate region, thereby removing the plurality of testing pins.

Optionally, the plurality of PLG proto-lines are cut along a second cutting line between a second dummy region and the array substrate region, thereby removing the shorting bar.

Optionally, the plurality of additional pads are a plurality of additional gate pads; the gate pad and the plurality of additional gate pads are respectively directly adjacent to a first cutting line between the array substrate region and the first dummy region; the data pad is directly adjacent to a second cutting line between the array substrate region and a second dummy region; and the shorting bar and the first terminals are in the second dummy region.

Optionally, prior to providing the substrate, the method further comprises forming a plurality of gate lines and a plurality of gate lead wires respectively connected to the plurality of gate lines; the plurality of gate lead wires, the first portion, and the second portion respectively extend at least partially into the respective one of the plurality of additional pads; the first portion is on a first side of the plurality of gate lead wires; and the second portion is on a second side of the plurality of gate lead wires.

Optionally, the method further comprises testing connectivity of a plurality of data lines in the substrate using a plurality of data line testing pads and a plurality of data lead wire shorting bars; wherein the plurality of PLG proto-lines and a plurality of data lead wires respectively extend at least partially into the data pad; the plurality of data lead wires are respectively connected to the plurality of data lines.

In another aspect, the present disclosure provides an array substrate fabricated by the method described herein.

In another aspect, the present disclosure provides a display apparatus, comprising the array substrate described herein or fabricated by a method described herein, the gate driving integrated circuit bonded to the gate pad, and the data driving integrated circuit bonded to the data pad.

In another aspect, the present disclosure provides a probe unit for testing connectivity of a plurality of PLG proto-lines in a substrate, comprising a printing circuit board; a probe block; and N number of a plurality of connecting lines respectively connecting the probe block and the printing circuit board; wherein the printing circuit board comprises N number of a plurality of transistors connected in series; and a light emitting element; wherein gate electrodes of the N number of a plurality of transistors are respectively electrically connected to the N number of a plurality of connecting lines; a source electrode of a first transistor of the N number of the plurality of transistors is electrically connected to a first connecting line of the N number of a plurality of connecting lines; a drain electrode of a last transistor of the N number of the plurality of transistors is electrically connected to the light emitting element; a source electrode of an n-th transistor between the first transistor and the last transistor is connected to a drain electrode of a (n−1)-th transistor, 1<n<N; and a drain electrode of the n-th transistor is connected to a source electrode of a (n+1)-th transistor.

In another aspect, the present disclosure provides an array substrate, comprising a gate pad configured to bond a gate driving integrated circuit; a data pad configured to bond a data driving integrated circuit; a plurality of peripheral layout gate (PLG) lines configured to transmit signals between a gate driving integrated circuit bonded to the gate pad and a data driving integrated circuit bonded to the data pad; a PLG testing pad; and a plurality of first testing pads.

Optionally, the array substrate further comprises a plurality of additional pads between the data pad and the gate pad; and a plurality of additional PLG lines configured to transmit signals between adjacent additional pads.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a method of fabricating an array substrate, an array substrate, a display apparatus, and a probe unit that substantially obviate one or more of the problems due to limitations and disadvantages of the related art. In one aspect, the present disclosure provides a method of fabricating an array substrate. In some embodiments, the method includes providing a substrate comprising a gate pad configured to bond a gate driving integrated circuit, a data pad configured to bond a data driving integrated circuit, and a plurality of peripheral layout gate (PLG) proto-lines connecting the gate pad and the data pad; forming a PLG testing pad on the substrate; forming a shorting bar connecting the PLG testing pad to first terminals of the plurality of PLG proto-lines; forming a plurality of testing pins respectively connected to second terminals of the plurality of PLG proto-lines, wherein the plurality of testing pins are formed in a first dummy region of the substrate, the first dummy region is adjacent to an array substrate region of the substrate; and connecting the plurality of testing pins to a probe unit to test connectivity of the plurality of PLG proto-lines.

Figure 1:
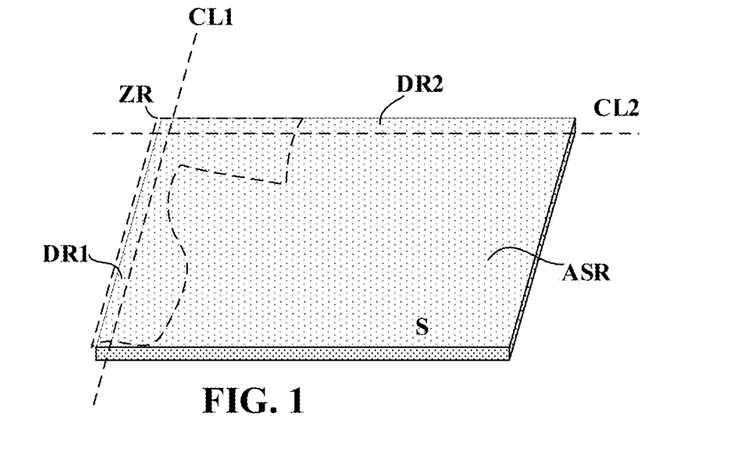
FIG. 1 shows a substrate for fabricating an array substrate in some embodiments according to the present disclosure.

FIG. 1 is a substrate for fabricating an array substrate in some embodiments according to the present disclosure. Referring to FIG. 1, the substrate S is provided for fabricating an array substrate. Subsequent to testing connectivity of signal lines in the substrate S, the substrate S is cut to form the array substrate. For example, the substrate S may be cut along a first cutting line CL1, and along a second cutting line CL2. The substrate S thus includes an array substrate region ASR, a first dummy region DR1, and a second dummy region DR2. The first cutting line CL1 is a first boundary line between the first dummy region DR1 and the array substrate region ASR. The second cutting line CL2 is a second boundary line between the second dummy region DR2 and the array substrate region ASR.

Figure 2:
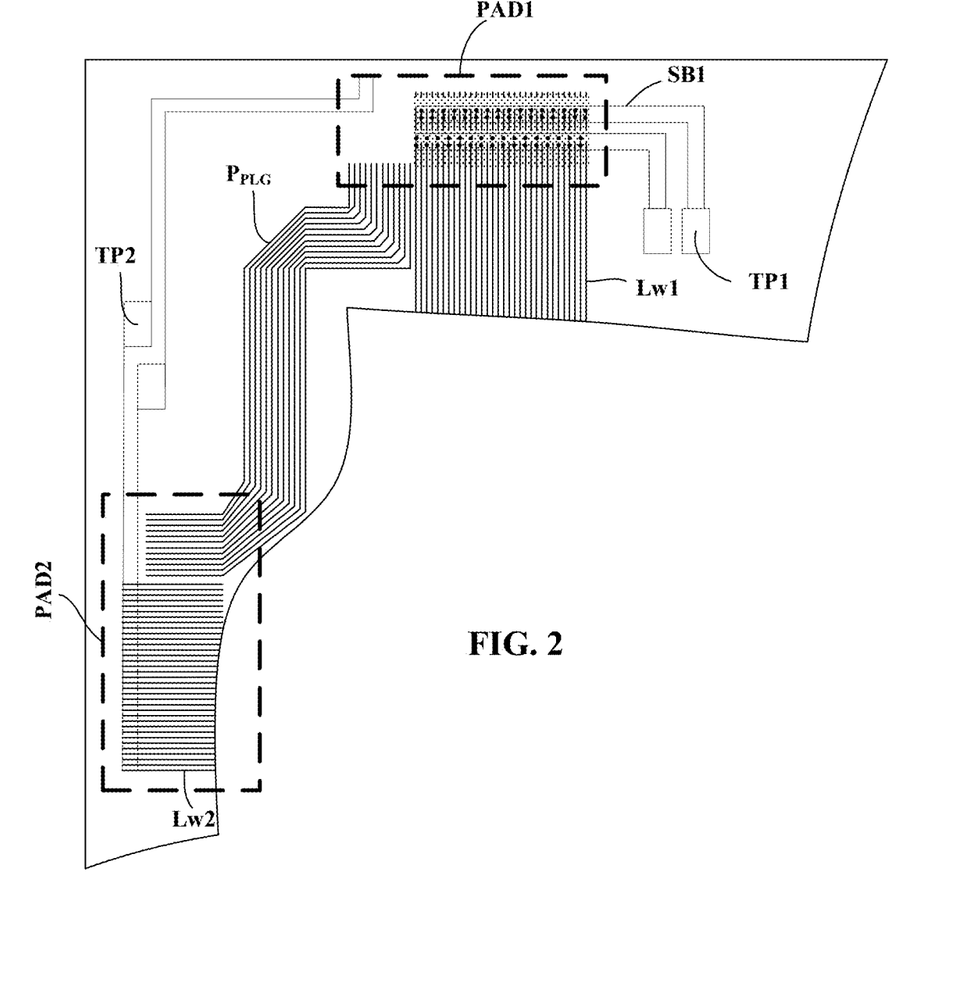
FIG. 2 is a partial view of the structure of a substrate in a zoom-in region in FIG. 1.

FIG. 2 is a partial view of the structure of a substrate in a zoom-in region in FIG. 1. The structure of the substrate S in a zoom-in region ZR in FIG. 1 is illustrated in FIG. 2. Referring to FIG. 2, the substrate includes a first pad PAD1 and a second pad PAD2. The first pad PAD1 and the second pad PAD2 are a gate pad configured to bond a gate driving integrated circuit, a data pad configured to bond a data driving integrated circuit. Optionally, the first pad PAD1 is a data pad configured to bond a data driving integrated circuit, and the second pad PAD2 is a gate pad configured to bond a gate driving integrated circuit. Optionally, the first pad PAD1 is a gate pad configured to bond a gate driving integrated circuit, and the second pad PAD2 is a data pad configured to bond a data driving integrated circuit.

Referring to FIG. 2, the substrate in some embodiments further includes a plurality of first testing pads TP1 and a plurality of second testing pads TP2. Optionally, the substrate further includes a plurality of first wire shorting bars SB1 for testing connectivity of a plurality of first signal lines and a plurality of second signal lines. In one example, the plurality of first signal lines are a plurality of data lines, and the plurality of second signal lines are a plurality of gate lines. In another example, the plurality of first signal lines are a plurality of gate lines, and the plurality of second signal lines are a plurality of data lines. The substrate further includes a plurality of first lead wires Lw1 respectively connected to the plurality of first signal lines, and a plurality of second lead wires Lw2 respectively connected to the plurality of second signal lines. The plurality of first lead wires Lw1 at least partially extend into the first pad PAD1, the plurality of second lead wires Lw2 at least partially extend into the second pad PAD2. In one example, the plurality of first lead wires Lw1 are a plurality of data lead wires respectively connected to a plurality of data lines, and the plurality of second lead wires Lw2 are a plurality of gate lead wires respectively connected to a plurality of gate lines. In another example, the plurality of first lead wires Lw1 are a plurality of gate lead wires respectively connected to a plurality of gate lines, and the plurality of second lead wires Lw2 are a plurality of data lead wires respectively connected to a plurality of data lines.

Referring to FIG. 2 again, the substrate in some embodiments further includes a plurality of peripheral layout gate (PLG) proto-lines $P_{PLG}$ connecting the first pad PAD1 and the second pad PAD2 (e.g., connecting a gate pad and a data pad). When the substrate is cut into an array substrate, and the plurality of PLG proto-lines $P_{PLG}$ are cut to form a plurality of PLG lines, a display apparatus is formed using the array substrate. In the display apparatus, a gate driving integrated circuit bonded to the gate pad, and a data driving integrated circuit bonded to the data pad, and the plurality of PLG lines are configured to transmit signals between the gate driving integrated circuit and the data driving integrated circuit. The plurality of PLG proto-lines $P_{PLG}$ at least partially extend into the first pad PAD1, and at least partially extend into the second pad PAD2.

The inventors of the present disclosure discover that, it is extremely difficult to test connectivity of the plurality of PLG proto-lines $P_{PLG}$ in the substrate as depicted in FIG. 2. While the plurality of first testing pads TP1 and the plurality of second testing pads TP2 may be used to test connectivity of the plurality of first signal lines and the plurality of second signal lines, the plurality of PLG proto-lines $P_{PLG}$ cannot be included in the testing. When one or more of the plurality of PLG proto-lines $P_{PLG}$ have a connectivity issue without being detected, the array substrate cut from the substrate would have defects, resulting in waste of materials and resources in subsequent fabrication processes. The inventors of the present disclosure discover a surprisingly effective method for testing the connectivity of the plurality of PLG proto-lines $P_{PLG}$.

Figure 3:
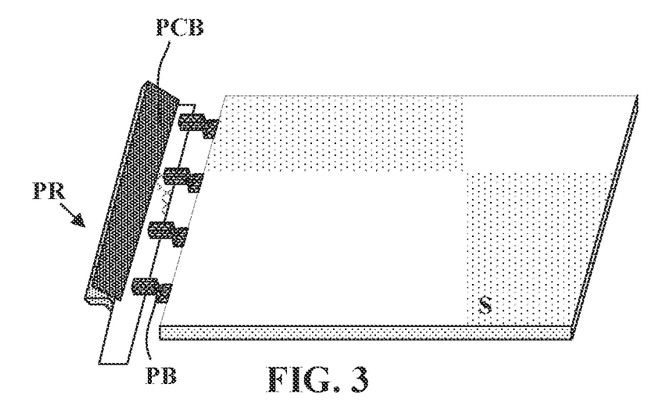
FIG. 3 illustrates a method of fabricating an array substrate in some embodiments according to the present disclosure.

FIG. 3 illustrates a method of fabricating an array substrate in some embodiments according to the present disclosure. Referring to FIG. 3, the method includes providing a substrate S, and using a probe unit PR to test connectivity of a plurality of PLG proto-lines in the substrate S. The probe unit PR includes a printed circuit board PCB and a probe block PB. The probe block PB is electrically connected to the printed circuit board PCB and electrically connected to the plurality of PLG proto-lines in the substrate S. The probe block PB is an aggregate of electrical contacts. The probe block PB may be implemented in a blade type, or a needle type, or a film type.

Figure 4:
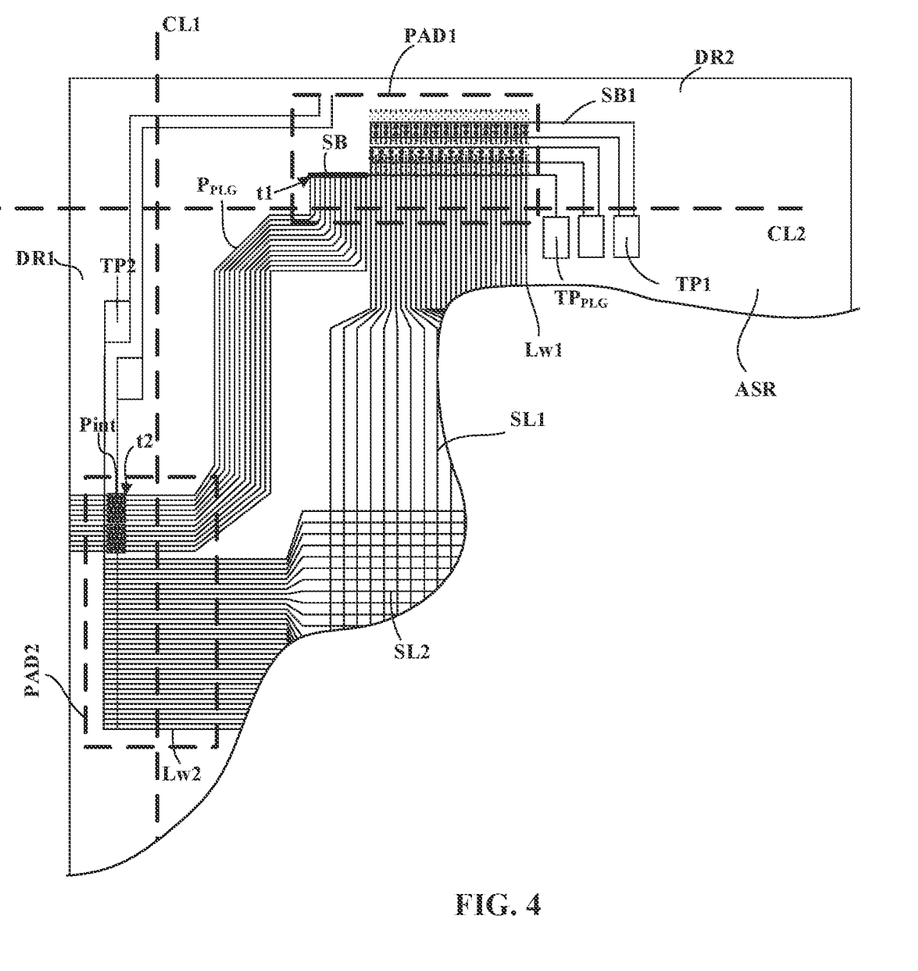
FIG. 4 is a partial view of the structure of a substrate in some embodiments according to the present disclosure.

FIG. 4 is a partial view of the structure of a substrate in some embodiments according to the present disclosure. Referring to FIG. 4, the substrate in some embodiments further includes a PLG testing pad $TP_{PLG}$ and a shorting bar SB connecting the PLG testing pad $TP_{PLG}$ to first terminals t1 of the plurality of PLG proto-lines $P_{PLG}$. For example, the shorting bar SB shorts the first terminals t1 of the plurality of PLG proto-lines $P_{PLG}$, and connects them to the PLG testing pad $TP_{PLG}$. When a testing voltage signal is applied to the PLC testing pad $TP_{PLG}$, the testing voltage is simultaneously applied to the first terminals t1 of the plurality of PLG proto-lines $P_{PLG}$. Moreover, the substrate in some embodiments further includes a plurality of testing pins Pint respectively connected to second terminals t2 of the plurality of PLG proto-lines $P_{PLG}$. The plurality of testing pins Pint are in a first dummy region DR1 of the substrate. The first dummy region DR1 is adjacent to an array substrate region ASR of the substrate. When the testing voltage signal is applied to the PLG testing pad $TP_{PLG}$, the testing voltage is simultaneously applied to the plurality of testing pins Pint.

Accordingly, in some embodiments, the method of fabricating the array substrate further includes providing a substrate comprising a gate pad configured to bond a gate driving integrated circuit, a data pad configured to bond a data driving integrated circuit, and a plurality of PLG proto-lines $P_{PLG}$ connecting the gate pad and the data pad; forming a PLG testing pad $TP_{PLG}$ on the substrate; forming a shorting bar SB connecting the PLG testing pad $TP_{PLG}$ to first terminals t1 of the plurality of PLG proto-lines $P_{PLG}$; and forming a plurality of testing pins Pint respectively connected to second terminals t2 of the plurality of PLG proto-lines $P_{PLG}$. The plurality of testing pins Pint are formed in a first dummy region DR1 of the substrate, the first dummy region DR1 is adjacent to an array substrate region ASR of the substrate.

In some embodiments, the method of fabricating the array substrate further includes forming a plurality of first signal lines SL1, forming a plurality of second signal lines SL2, forming a plurality of first lead wires Lw1, and forming a plurality of second lead wires Lw2. The plurality of first lead wires Lw1 are formed to respectively connect to the plurality of first signal lines SL1. The plurality of second lead wires Lw2 are formed to respectively connect to the plurality of second signal lines SL2. Optionally, the plurality of first signal lines SL1 are a plurality of data lines, the plurality of first lead wires Lw1 are a plurality of data line lead wires, the plurality of second signal lines SL2 are a plurality of gate lines, and the plurality of second lead wires Lw2 are a plurality of gate line lead wires. Optionally, the method further includes forming a plurality of first wire shorting bars SB1 for testing connectivity of a plurality of first signal lines SL1. Optionally, the plurality of first wire shorting bars SB1 are a plurality of data line lead wires shorting bars.

Figure 5:
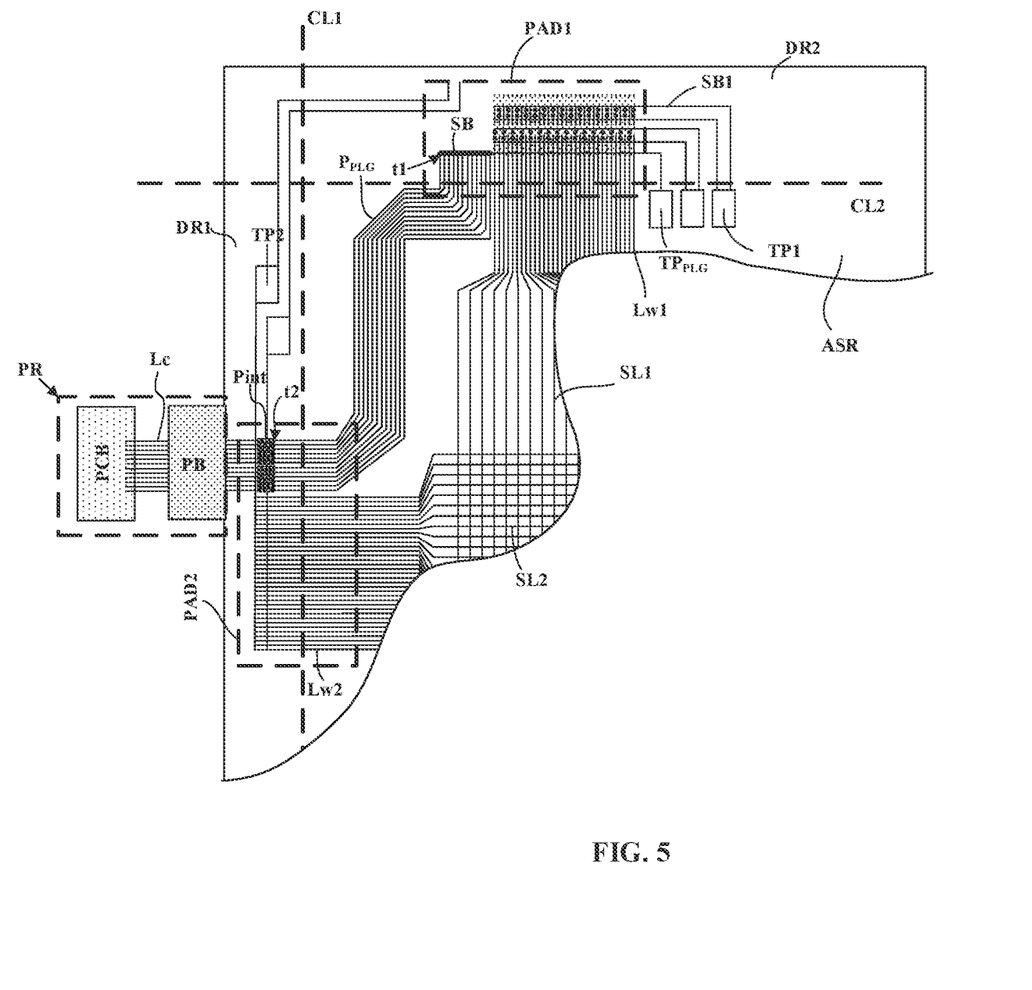
FIG. 5 illustrates a method of fabricating an array substrate in some embodiments according to the present disclosure.

FIG. 5 illustrates a method of fabricating an array substrate in some embodiments according to the present disclosure. Referring to FIG. 3 and FIG. 5, the method in some embodiments further includes connecting the plurality of testing pins Pint to a probe unit PR to test connectivity of the plurality of PLG proto-lines $P_{PLG}$. Specifically, in some embodiments, the method includes connecting the plurality of testing pins Pint to a printing circuit board PCB of the probe unit PR through a probe block PB of the probe unit PR.

Figure 6:
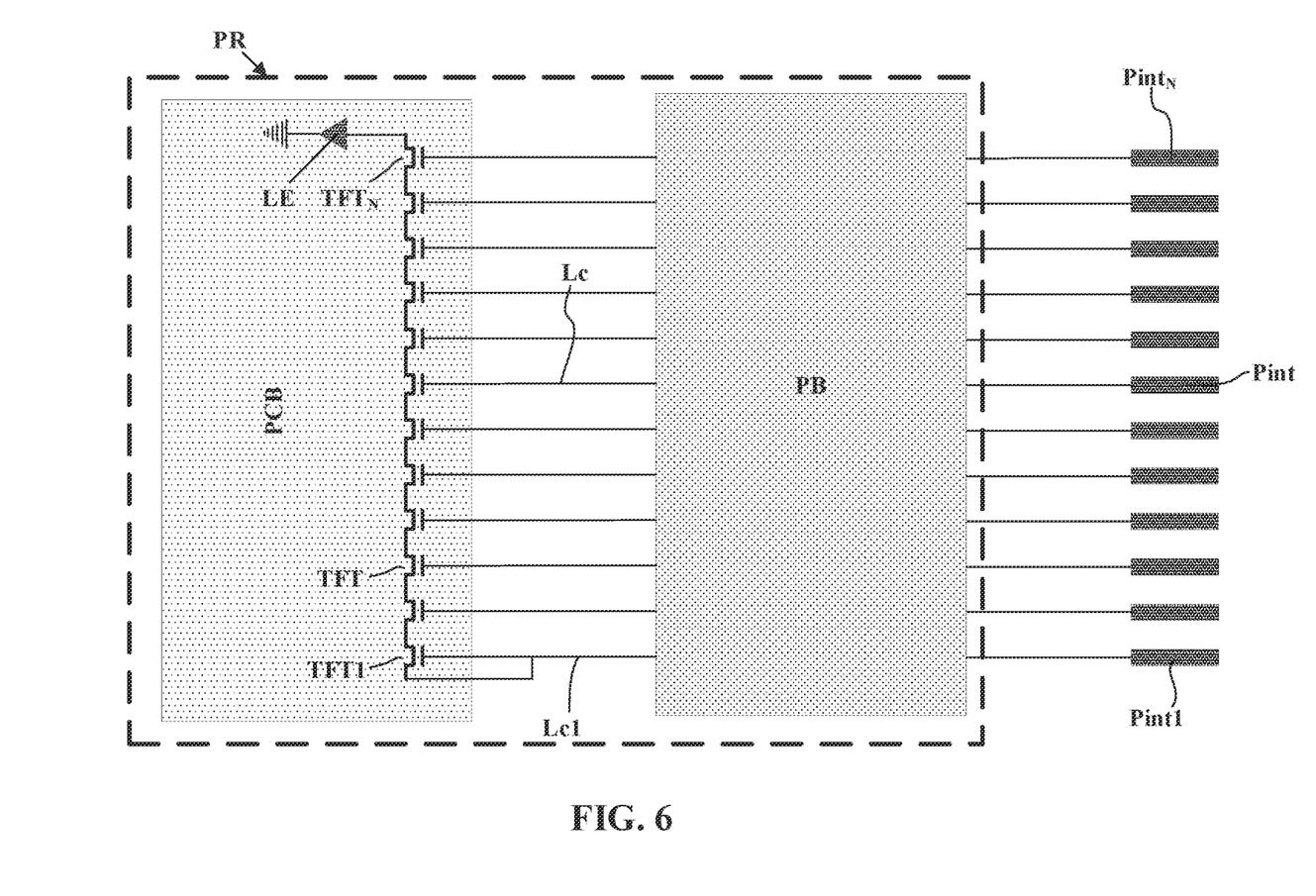
FIG. 6 is a schematic diagram illustrating the structure of a probe unit in some embodiments according to the present disclosure.

FIG. 6 is a schematic diagram illustrating the structure of a probe unit in some embodiments according to the present disclosure. Referring to FIG. 6, the probe unit PR in some embodiments includes a printing circuit board PCB; a probe block PB; and N number of a plurality of connecting lines Lc respectively connecting the probe block PB and the printing circuit board PCB. In some embodiments, the printing circuit board includes N number of a plurality of transistors TFT connected in series; and a light emitting element LE. As shown in FIG. 6, in one example, gate electrodes of the N number of a plurality of transistors TFT are respectively electrically connected to the N number of a plurality of connecting lines Lc. A source electrode of a first transistor TFT1 of the N number of the plurality of transistors TFT is electrically connected to a first connecting line Lc1 of the N number of a plurality of connecting lines Lc. A drain electrode of a last transistor $TFT_N$ of the N number of the plurality of transistors TFT is electrically connected to the light emitting element LE. A source electrode of an n-th transistor between the first transistor TFT1 and the last transistor $TFT_N$ is connected to a drain electrode of a (n−1)-th transistor, 1<n<N. A drain electrode of the n-th transistor is connected to a source electrode of a (n+1)-th transistor.

Referring to FIG. 5 and FIG. 6, by connecting the plurality of testing pins Pint to a printing circuit board PCB of the probe unit PR through a probe block PB of the probe unit PR, the N number of the plurality of testing pins Pint are respectively electrically connected to the gate electrodes of the N number of a plurality of transistors TFT connected in series in the printing circuit board PCB. The first test pin Pint1 of the N number of the plurality of testing pins is also electrically connected to a source electrode of a first transistor of the N number of the plurality of transistors TFT, e.g., through the probe block PB and the first connecting line Lc1 of the N number of a plurality of connecting lines Lc.

In some embodiments, the method further includes a step of testing connectivity of the plurality of PLG proto-lines $P_{PLG}$. Specifically, the step of testing connectivity includes providing a testing voltage signal to the PLG testing pad $TP_{PLG}$. When the testing voltage signal is applied to the PLG testing pad $TP_{PLG}$, the testing voltage signal is simultaneously applied to the plurality of PLG proto-lines $P_{PLG}$.

When connectivity in at least one of the plurality of PLG proto-lines $P_{PLG}$ is compromised, e.g., at least one of the plurality of PLG proto-lines $P_{PLG}$ is damaged or otherwise open, the testing voltage signal cannot transmit to the light emitting element LE because at least one of the plurality of transistors TFT is in a turning-off state. Thus, upon providing the testing voltage signal to the PLG testing pad $TP_{PLG}$, the light emitting element LE in a turning-off state indicates connectivity in at least one of the plurality of PLG proto-lines $P_{PLG}$ is compromised.

In some embodiments, the method further includes, based upon the light emitting element being in the turning-off state, either repairing the compromised connectivity in at least one of the plurality of PLG proto-lines $P_{PLG}$, or discarding the substrate to save costs.

When connectivity in each of the plurality of PLG proto-lines $P_{PLG}$ is intact, e.g., each of the plurality of PLG proto-lines $P_{PLG}$ is not damaged or otherwise open, the testing voltage signal is simultaneously applied to the gate electrodes of the N number of a plurality of transistors TFT and the source electrode of the first transistor TFT1 of the N number of the plurality of transistors TFT. The N number of the plurality of transistors TFT are all turned on by the testing voltage signal. The testing voltage signal is transmitted through the N number of the plurality of transistors TFT to the light emitting element (e.g., a light emitting diode). Thus, upon providing the testing voltage signal to the PLG testing pad $TP_{PLG}$, the light emitting element LE in a turning-on state indicates connectivity in each of the plurality of PLG proto-lines $P_{PLG}$ is intact.

Figure 7:
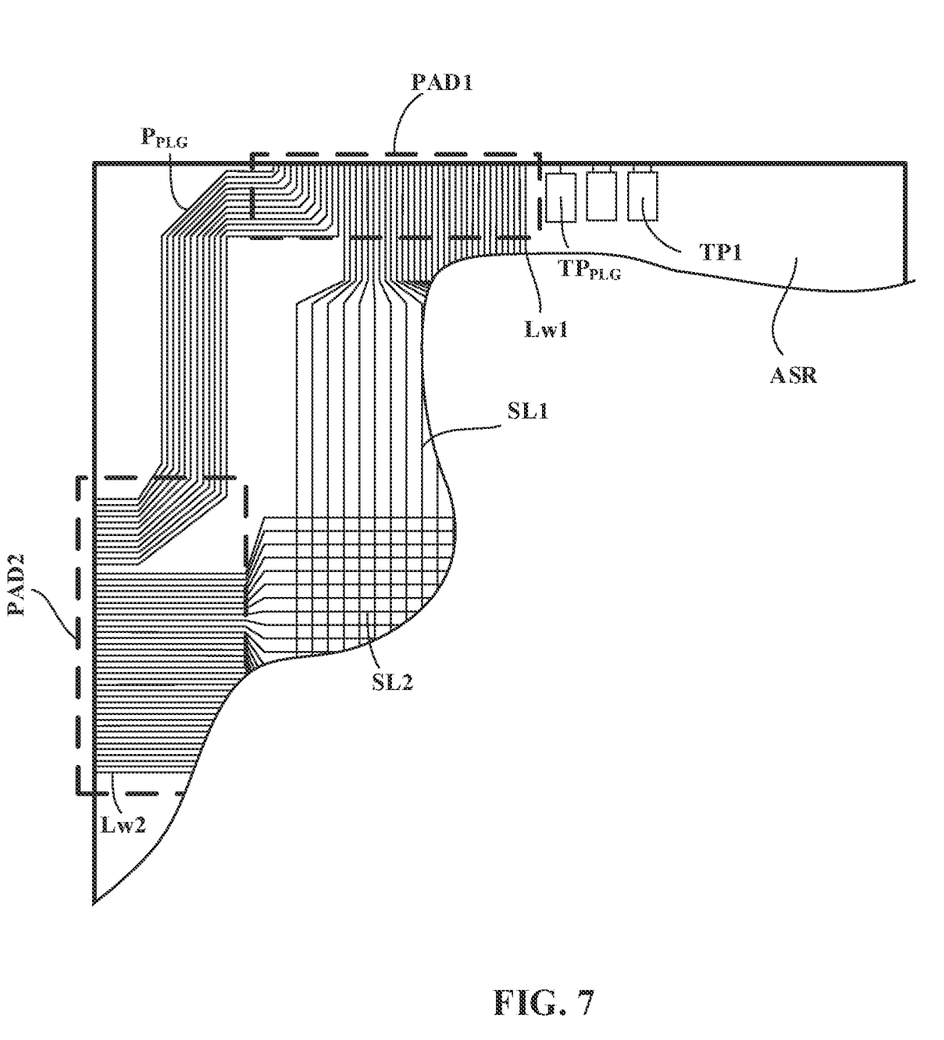
FIG. 7 is a partial view of an array substrate fabricated by a method in some embodiments according to the present disclosure.

In some embodiments, the method further includes, based upon the light emitting element being in the turning-on state, cutting the substrate to form an array substrate. FIG. 7 is a partial view of an array substrate fabricated by a method in some embodiments according to the present disclosure. Referring to FIG. 4 and FIG. 7, in some embodiments, the plurality of PLG proto-lines $P_{PLG}$ are cut to form a plurality of PLG lines PLGL. The plurality of PLG lines PLGL are configured to transmit signals between the gate driving integrated circuit and the data driving integrated circuit in a display apparatus having the array substrate, wherein the gate driving integrated circuit bonded to the gate pad (e.g., the second pad PAD2), and the data driving integrated circuit bonded to the data pad (e.g., the first pad PAD1).

In some embodiments, the method includes cutting the substrate along a first cutting line CL1. The first cutting line CL1 is between the first dummy region DR1 and the array substrate region ASR. Referring to FIG. 4 and FIG. 7, as a result of cutting the substrate along the first cutting line CL1, the plurality of testing pins Pint are removed.

In some embodiments, the method includes cutting the substrate along a second cutting line CL2. The second cutting line CL2 is between the second dummy region DR2 and the array substrate region ASR. Referring to FIG. 4 and FIG. 7, as a result of cutting the substrate along the second cutting line CL2, the shorting bar SB is removed. The plurality of first wire shorting bars SB1 for testing connectivity of the plurality of first signal lines are also removed during cutting the substrate along the second cutting line CL2.

Figure 8:
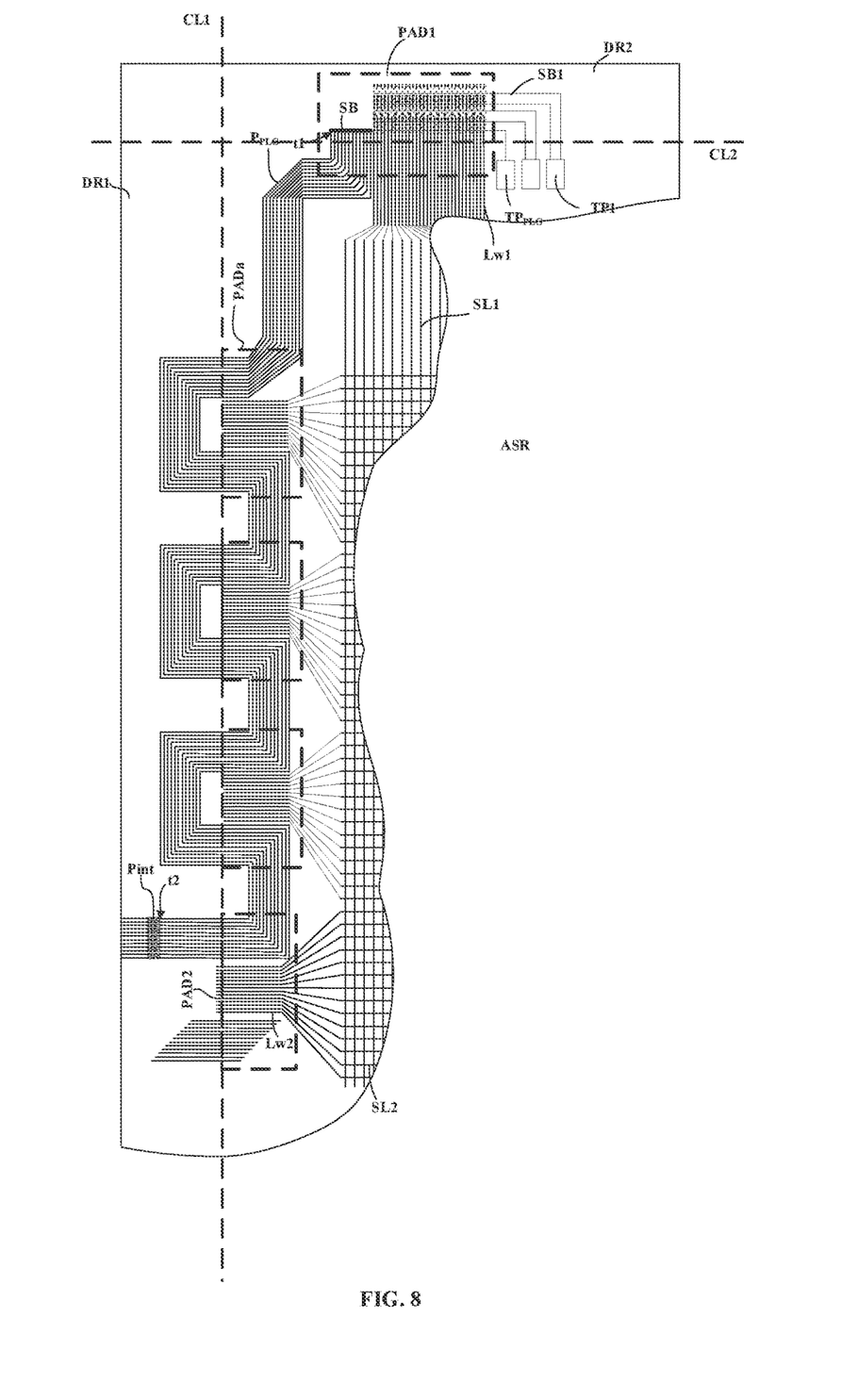
FIG. 8 is a partial view of the structure of a substrate in some embodiments according to the present disclosure.

FIG. 8 is a partial view of the structure of a substrate in some embodiments according to the present disclosure. Referring to FIG. 8, the substrate for fabricating the array substrate further includes a plurality of additional pads PADa between the first pad PAD1 and the second pad PAD2, for example, between a data pad and a gate pad. Optionally, the first pad PAD1 is a data pad configured to bond a data driving integrated circuit, the second pad PAD2 is a gate pad configured to bond a gate driving integrated circuit, and the plurality of additional pads PADa are a plurality of additional gate pads respectively configured to bond a plurality of additional gate driving integrated circuits. Optionally, the first pad PAD1 is a gate pad configured to bond a gate driving integrated circuit, the second pad PAD2 is a data pad configured to bond a data driving integrated circuit, and the plurality of additional pads PADa are a plurality of additional data pads respectively configured to bond a plurality of additional data driving integrated circuits.

Referring to FIG. 8, a respective one of the plurality of PLG proto-lines $P_{PLG}$ is formed to extend from a respective first terminal to a respective second terminal connecting to a respective one of the plurality of testing pins Pint. The plurality of PLG proto-limes $P_{PLG}$ surround three sides of a respective one of the plurality of additional pads PADa. On a side of the substrate having the plurality of additional pads PADa and the second pad PAD2, a respective one of the plurality of PLG proto-lines $P_{PLG}$ has an undulating line, surrounding three sides of each of the plurality of additional pads PADa.

Figure 9:
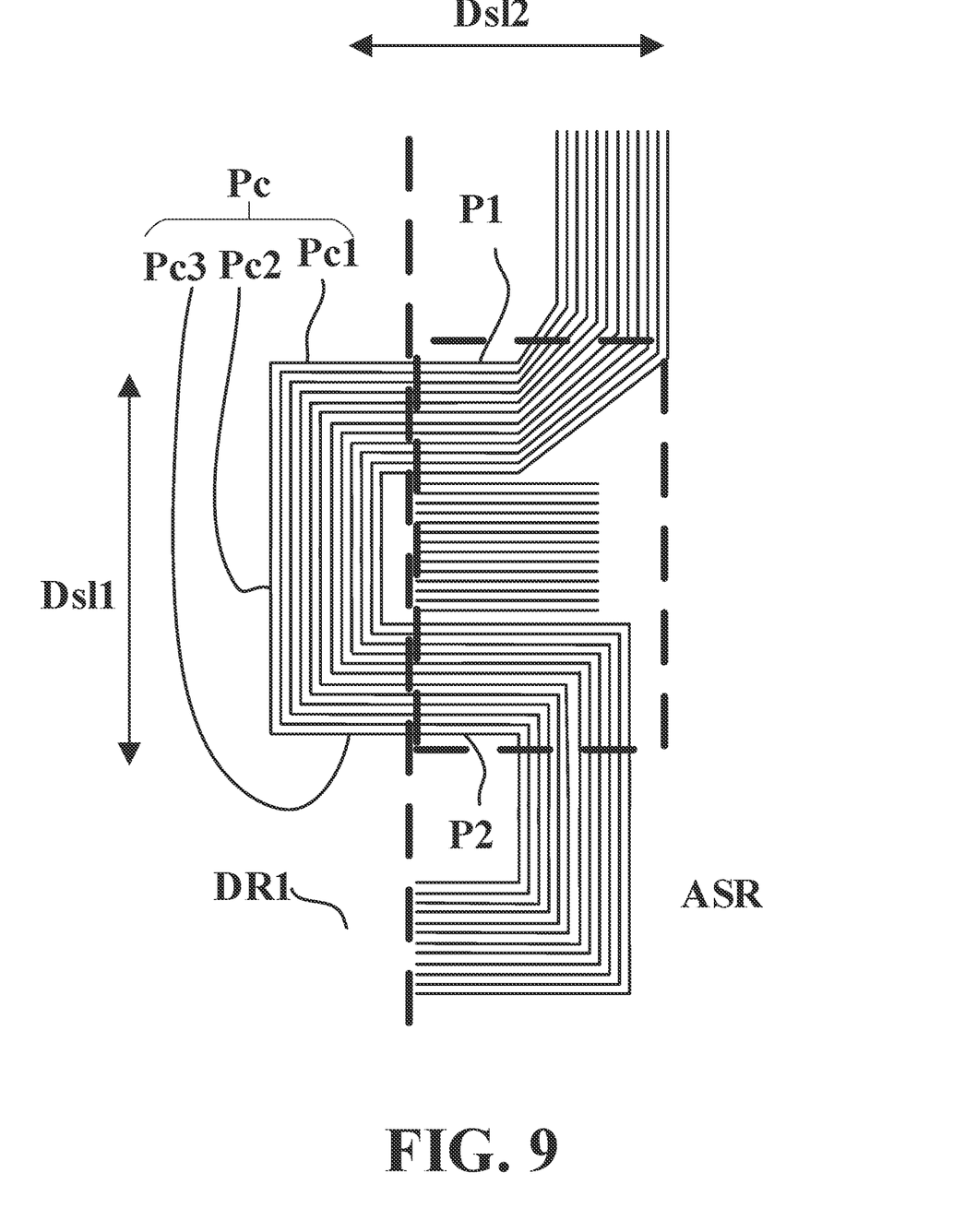
FIG. 9 illustrates the structure of a plurality of PLG proto-lines around an additional pad in some embodiments according to the present disclosure.

FIG. 9 illustrates the structure of a plurality of PLG proto-lines around an additional pad in some embodiments according to the present disclosure. Referring to FIG. 8 and FIG. 9, the respective one of the plurality of PLG proto-lines $P_{PLG}$ in some embodiments includes a first portion P1 and a second portion P2 respectively in the array substrate region ASR and respectively on two sides of a respective one of the plurality of additional pads PADa, and a connecting portion Pc connecting the first portion P1 and the second portion P2. The connecting portion Pc is in the first dummy region DR1.

In one example, the connecting portion Pc includes a first part Pc1, a second part Pc2, and a third part Pc3. Optionally, the second part Pc2 extends along a first extension direction of the plurality of first signal lines SL1. Optionally, the first portion P1 and the first part Pc1 extend along a second extension direction of the plurality of second signal lines SL2, from the array substrate region ASR into the first dummy region DR1. Optionally, the third part Pc3 and the second portion P2 extend along a second extension direction of the plurality of second signal lines SL2, from the first dummy region DR1 into the array substrate region ASR.

Figure 10:
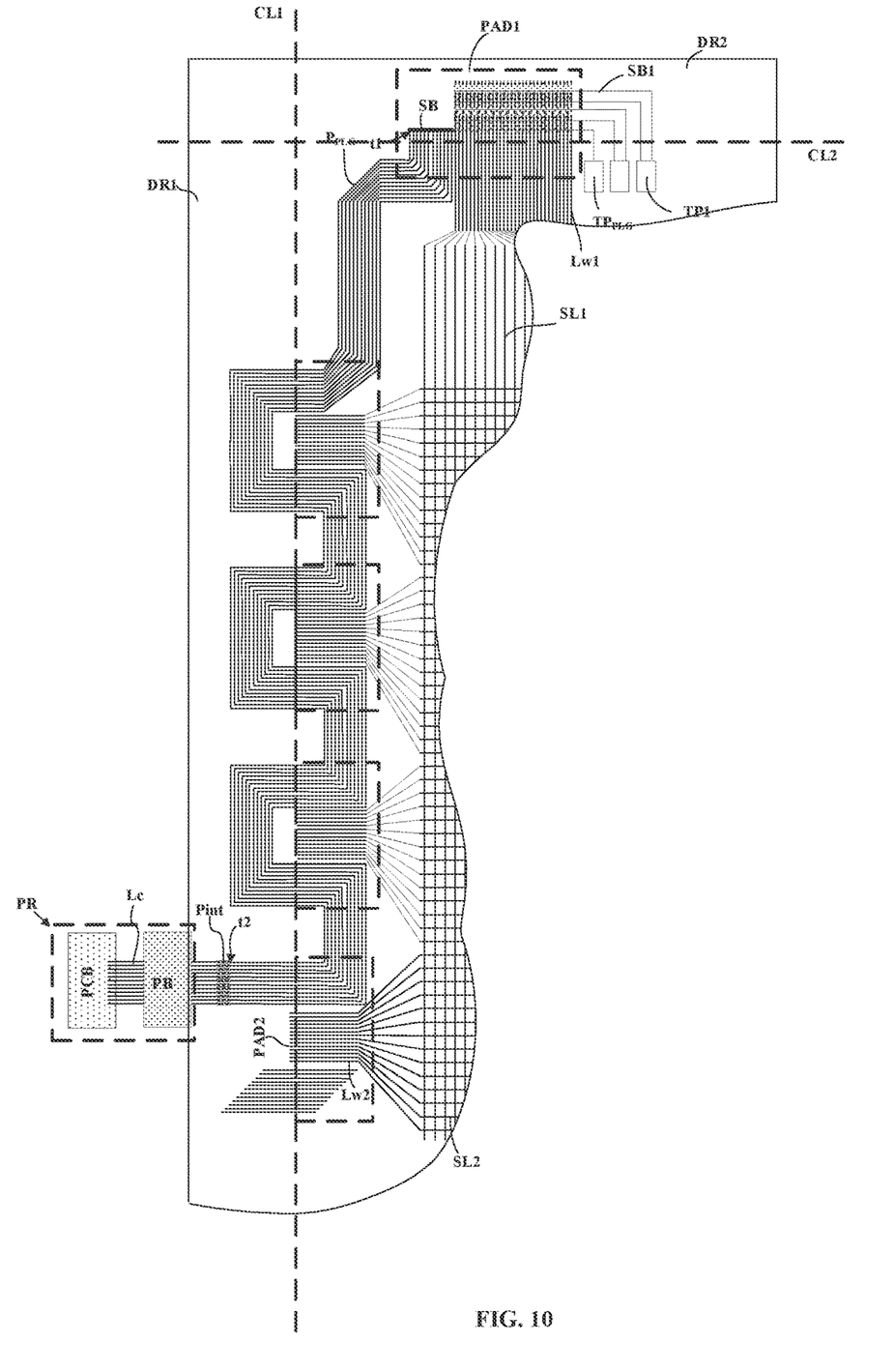
FIG. 10 illustrates a method of fabricating an array substrate in some embodiments according to the present disclosure.

FIG. 10 illustrates a method of fabricating an array substrate in some embodiments according to the present disclosure. Referring to FIG. 8 and FIG. 10, the method in some embodiments further includes connecting the plurality of testing pins Pint to a probe unit PR to test connectivity of the plurality of PLG proto-lines $P_{PLG}$. Specifically, in some embodiments, the method includes connecting the plurality of testing pins Pint to a printing circuit board PCB of the probe unit PR through a probe block PB of the probe unit PR.

Referring to FIG. 6 and FIG. 10, when connectivity in at least one of the plurality of PLG proto-lines $P_{PLG}$ is compromised, e.g., at least one of the plurality of PLG proto-lines $P_{PLG}$ is damaged or otherwise open, the testing voltage signal cannot transmit to the light emitting element LE because at least one of the plurality of transistors TFT is in a turning-off state. Thus, upon providing the testing voltage signal to the PLG testing pad $TP_{PLG}$, the light emitting element LE in a turning-off state indicates connectivity in at least one of the plurality of PLG proto-lines $P_{PLG}$ is compromised.

In some embodiments, the method further includes, based upon the light emitting element being in the turning-off state, either repairing the compromised connectivity in at least one of the plurality of PLG proto-lines $P_{PLG}$, or discarding the substrate to save costs.

Referring to FIG. 6 and FIG. 10, when connectivity in each of the plurality of PLG proto-lines $P_{PLG}$ is intact, e.g., each of the plurality of PLG proto-lines $P_{PLG}$ is not damaged or otherwise open, the testing voltage signal is simultaneously applied to the gate electrodes of the N number of a plurality of transistors TFT and the source electrode of the first transistor TFT1 of the N number of the plurality of transistors TFT. The N number of the plurality of transistors TFT are all turned on by the testing voltage signal. The testing voltage signal is transmitted through the N number of the plurality of transistors TFT to the light emitting element (e.g., a light emitting diode). Thus, upon providing the testing voltage signal to the PLG testing pad $TP_{PLG}$, the light emitting element LE in a turning-on state indicates connectivity in each of the plurality of PLG proto-lines $P_{PLG}$ is intact.

Figure 11:
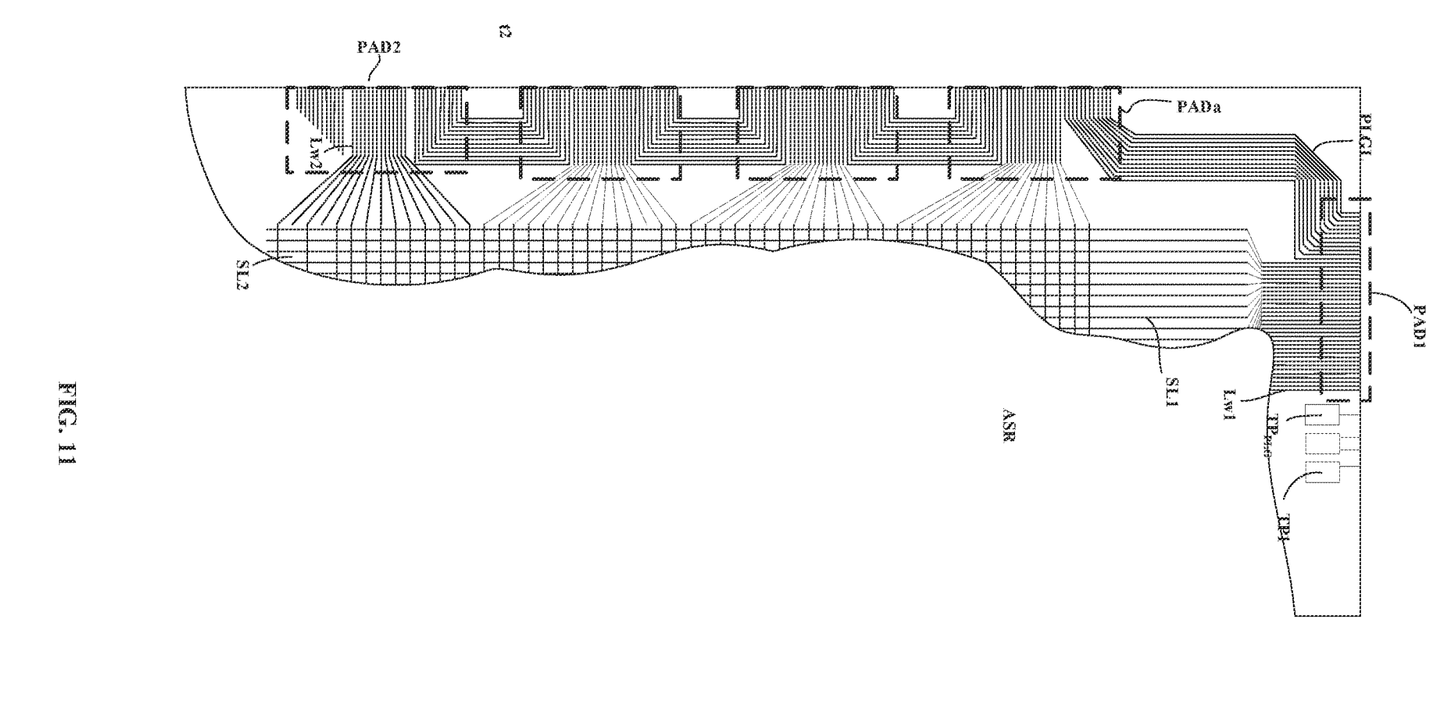
FIG. 11 is a partial view of an array substrate fabricated by a method in some embodiments according to the present disclosure.

In some embodiments, the method further includes, based upon the light emitting element being in the turning-on state, cutting the substrate to form an array substrate. FIG. 11 is a partial view of an array substrate fabricated by a method in some embodiments according to the present disclosure. Referring to FIG. 8 and FIG. 11, in some embodiments, the plurality of PLG proto-lines $P_{PLG}$ are cut to form a plurality of PLG lines PLGL. The plurality of PLG lines PLGL are configured to transmit signals between the gate driving integrated circuit and the data driving integrated circuit in a display apparatus having the array substrate, wherein the gate driving integrated circuit bonded to the gate pad (e.g., the second pad PAD2), and the data driving integrated circuit bonded to the data pad (e.g., the first pad PAD1).

In some embodiments, the method includes cutting the substrate along a first cutting line CL1. The first cutting line CL1 is between the first dummy region DR1 and the array substrate region ASR. Referring to FIG. 8 and FIG. 11, as a result of cutting the substrate along the first cutting line CL1, the plurality of testing pins Pint are removed. The respective one of the plurality of PLG proto-lines $P_{PLG}$ is cut along the first cutting line CL1 thereby removing the connecting portion Pc.

In some embodiments, the method includes cutting the substrate along a second cutting line CL2. The second cutting line CL2 is between the second dummy region DR2 and the array substrate region ASR. Referring to FIG. 8 and FIG. 11, as a result of cutting the substrate along the second cutting line CL2, the shorting bar SB is removed. The plurality of first wire shorting bars SB1 for testing connectivity of the plurality of first signal lines are also removed during cutting the substrate along the second cutting line CL2.

Referring to FIG. 4, FIG. 7, FIG. 8, and FIG. 11, in some embodiments, the second pad PAD2 is a gate pad, and the plurality of additional pads PADa are a plurality of additional gate pads. The second pad PAD2 and the plurality of additional pads PADa are respectively directly adjacent to the first cutting line CL1 between the array substrate region ASR and the first dummy region DR1. The first pad PAD1 (e.g., a data pad) is directly adjacent to the second cutting line CL2 between the array substrate region ASR and a second dummy region DR2. The shorting bar SB and the first terminals t1 are in the second dummy region DR2, and are removed during the cutting step. The second terminals t2 are in the first dummy region DR1, and are removed during the cutting step.

Referring to FIG. 4, FIG. 7, FIG. 8, and FIG. 11, in some embodiments, prior to providing the substrate, the method further includes forming a plurality of first signal lines SL1 (e.g., a plurality of data lines), forming a plurality of first lead wires Lw1 respectively connected to the plurality of first signal lines SL1, forming a plurality of second signal lines SL2 (e.g., a plurality of gate lines), forming a plurality of second lead wires Lw2 respectively connected to the plurality of second signal lines SL2. Optionally, the plurality of second lead wires Lw2 (e.g., a plurality of gate line lead wires), the first portion P1, and the second portion P2 respectively extend at least partially into the respective one of the plurality of additional pads PADa. The first portion P1 is on a first side of the plurality of second lead wires Lw2, and the second portion P2 is on a second side of the plurality of second lead wires Lw2.

In some embodiments, the method further includes testing connectivity of a plurality of first signal lines (e.g., a plurality of data lines) in the substrate using a plurality of first testing pads TP1 (e.g., a plurality of data line testing pads) and a plurality of first wire shorting bars SB1 (e.g., a plurality of data lead wire shorting bars). The plurality of PLG proto-lines $P_{PLG}$ and a plurality of first lead wires Lw1 (e.g., a plurality of data line lead wires) respectively extend at least partially into the first pad PAD1 (e.g., a data pad), the plurality of first lead wires Lw1 (e.g., a plurality of data line lead wires) are respectively connected to the plurality of first signal lines SL1 (e.g., a plurality of data lines).

In another aspect, the present disclosure provides an array substrate fabricated by the method described herein. In some embodiments, the array substrate includes a plurality of gate lines, a plurality of data lines, a gate pad for bonding a gate driving integrated circuit, a data pad for bonding a data driving integrated circuit, a plurality of peripheral layout gate lines for connecting the gate pad and the data pad, a plurality of gate line lead wires respectively connected to the plurality of gate lines, and a plurality of data line lead wires respectively connected to the plurality of data lines. The plurality of peripheral layout gate lines, the plurality of gate line lead wires, the plurality of data line lead wires, the gate pad, and the data pad are in a peripheral region of the array substrate. In a display region of the array substrate, the array substrate includes a plurality of subpixels.

In another aspect, the present disclosure provides a display apparatus. In some embodiments, the display apparatus includes an array substrate described herein, a gate driving integrated circuit bonded to the gate pad, and a data driving integrated circuit bonded to the data pad. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a liquid crystal display apparatus.

In another aspect, the present disclosure provides a probe unit for testing connectivity of a plurality of PLG proto-lines in a substrate. In some embodiments, the probe unit includes a printing circuit board; a probe block; and N number of a plurality of connecting lines respectively connecting the probe block and the printing circuit board. The printing circuit board in some embodiments includes N number of a plurality of transistors connected in series; and a light emitting element. Optionally, gate electrodes of the N number of a plurality of transistors are respectively electrically connected to the N number of a plurality of connecting lines. Optionally, a source electrode of a first transistor of the N number of the plurality of transistors is electrically connected to a first connecting line of the N number of a plurality of connecting lines. Optionally, a drain electrode of a last transistor of the N number of the plurality of transistors is electrically connected to the light emitting element. Optionally, a source electrode of an n-th transistor between the first transistor and the last transistor is connected to a drain electrode of a (n−1)-th transistor, $1<n<N$. Optionally, a drain electrode of the n-th transistor is connected to a source electrode of a (n+1)-th transistor.

In another aspect, the present disclosure provides a substrate. In some embodiments, the substrate includes a gate pad configured to bond a gate driving integrated circuit; a data pad configured to bond a data driving integrated circuit; a plurality of peripheral layout gate (PLG) proto-lines connecting the gate pad and the data pad; a PLG testing pad; a shorting bar connecting the PLG testing pad to first terminals of the plurality of PLG proto-lines; and a plurality of testing pins respectively connected to second terminals of the plurality of PLG proto-lines, wherein the plurality of testing pins are formed in a first dummy region of the substrate, the first dummy region is adjacent to an array substrate region of the substrate.

In some embodiments, the substrate further includes a plurality of additional pads between the data pad and the gate pad. Optionally, a respective one of the plurality of PLG proto-lines extends from a respective first terminal to a respective second terminal connecting to a respective one of the plurality of testing pins; and the respective one of the plurality of PLG proto-lines comprises a first portion and a second portion respectively in the array substrate region and respectively on two sides of a respective one of the plurality of additional pads, and a connecting portion connecting the first portion and the second portion, the connecting portion being in the first dummy region.

In some embodiments, the plurality of additional pads are a plurality of additional gate pads. Optionally, the gate pad and the plurality of additional gate pads are respectively directly adjacent to first boundary line between the array substrate region and the first dummy region. Optionally, the data pad is directly adjacent to a second boundary line between the array substrate region and a second dummy region. Optionally, the shorting bar and the first terminals are in the second dummy region.

In some embodiments, the substrate further includes a plurality agate lead wires respectively connected to a plurality of gate lines. Optionally, the plurality of gate lead wires, the first portion, and the second portion respectively extend at least partially into the respective one of the plurality of additional pads. Optionally, the first portion is on a first side of the plurality of gate lead wires. Optionally, the second portion is on a second side of the plurality of gate lead wires.

In some embodiments, the substrate further includes a plurality of data line testing pads and a plurality of data lead wire shorting bars for testing connectivity of a plurality of data lines in the substrate. Optionally, the plurality of PLG proto-lines and a plurality of data lead wires respectively extend at least partially into the data pad. Optionally, the plurality of data lead wires are respectively connected to the plurality of data lines.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating an array substrate, comprising:
providing a substrate comprising a gate pad configured to be bonded to a gate driving integrated circuit, a data pad configured to be bonded to a data driving integrated circuit, and a plurality of first connecting lines connecting the gate pad and the data pad;
forming a testing pad on the substrate;
forming a shorting bar connecting the testing pad to first terminals of the plurality of first connecting lines;
forming a plurality of testing pins respectively connected to second terminals of the plurality of first connecting lines, wherein the plurality of testing pins are formed in a first dummy region of the substrate, the first dummy region is adjacent to an array substrate region of the substrate; and
connecting the plurality of testing pins to a probe unit to test connectivity of the plurality of first connecting lines.

2. The method of claim 1, prior to providing the substrate, further comprising forming a plurality of additional pads between the data pad and the gate pad;
wherein a respective one of the plurality of first connecting lines is formed to extend from a respective first terminal to a respective second terminal connecting to a respective one of the plurality of testing pins; and
the respective one of the plurality of first connecting lines comprises a first portion and a second portion respectively in the array substrate region and respectively on two sides of a respective one of the plurality of additional pads, and a connecting portion connecting the first portion and the second portion, the connecting portion being in the first dummy region.

3. The method of claim 1, wherein connecting the plurality of testing pins to the probe unit comprises connecting the plurality of testing pins to a printing circuit board of the probe unit through a probe block of the probe unit thereby electrically connecting N number of the plurality of testing pins respectively to gate electrodes of N number of a plurality of transistors connected in series in the printing circuit board;
wherein a first test pin of the N number of the plurality of testing pins is also electrically connected to a source electrode of a first transistor of the N number of the plurality of transistors;
a drain electrode of a last transistor of the N number of the plurality of transistors is electrically connected to a light emitting element of the printing circuit board;
a source electrode of an n-th transistor between the first transistor and the last transistor is connected to a drain electrode of a (n−1)-th transistor, 1<n<N;
a drain electrode of the n-th transistor is connected to a source electrode of a (n+1)-th transistor.

4. The method of claim 1, further comprising providing a testing voltage signal to the testing pad;
wherein, upon providing the testing voltage signal to the testing pad, a light emitting element in a turning-off state indicates connectivity in at least one of the plurality of first connecting lines is compromised.

5. The method of claim 1, further comprising providing a testing voltage signal to the testing pad;
wherein, upon providing the testing voltage signal to the testing pad, a light emitting element in a turning-on state indicates connectivity in each of the plurality of first connecting lines is intact.

6. The method of claim 5, further comprising, based upon the light emitting element being in the turning-on state, cutting the substrate to form an array substrate;
wherein the plurality of first connecting lines are cut to form a plurality of second connecting lines, the plurality of second connecting lines are configured to transmit signals between the gate driving integrated circuit and the data driving integrated circuit in a display apparatus having the array substrate, the gate driving integrated circuit bonded to the gate pad, and the data driving integrated circuit bonded to the data pad.

7. The method of claim 6, prior to providing the substrate, further comprising forming a plurality of additional pads between the data pad and the gate pad;
wherein a respective one of the plurality of first connecting lines is formed to extend from a respective first terminal to a respective second terminal connecting to a respective one of the plurality of testing pins; and
the respective one of the plurality of first connecting lines comprises a first portion and a second portion respectively in the array substrate region and respectively on two sides of a respective one of the plurality of additional pads, and a connecting portion connecting the first portion and the second portion, the connecting portion being in the first dummy region; and
the respective one of the plurality of first connecting lines is cut along a first cutting line thereby removing the connecting portion.

8. The method of claim 6, wherein the plurality of first connecting lines are cut along a first cutting line between the first dummy region and the array substrate region, thereby removing the plurality of testing pins.

9. The method of claim 6, wherein the plurality of first connecting lines are cut along a second cutting line between a second dummy region and the array substrate region, thereby removing the shorting bar.

10. The method of claim 2, wherein the plurality of additional pads are a plurality of additional gate pads;
the gate pad and the plurality of additional gate pads are respectively directly adjacent to a first cutting line between the array substrate region and the first dummy region;
the data pad is directly adjacent to a second cutting line between the array substrate region and a second dummy region; and
the shorting bar and the first terminals are in the second dummy region.

11. The method of claim 10, wherein, prior to providing the substrate, further comprising forming a plurality of gate lines and a plurality of gate line lead wires respectively connected to the plurality of gate lines;

the plurality of gate line lead wires, the first portion, and the second portion respectively extend at least partially into the respective one of the plurality of additional pads;

the first portion is on a first side of the plurality of gate line lead wires; and the second portion is on a second side of the plurality of gate line lead wires.

12. The method of claim 1, further comprising testing connectivity of a plurality of data lines in the substrate using a plurality of data line testing pads and a plurality of data lead wire shorting bars;

wherein the plurality of first connecting lines and a plurality of data lead wires respectively extend at least partially into the data pad;

the plurality of data lead wires are respectively connected to the plurality of data lines.

13. An array substrate fabricated by the method of claim 1.

14. A display apparatus, comprising the array substrate of claim 13, the gate driving integrated circuit bonded to the gate pad, and the data driving integrated circuit bonded to the data pad.

15. An array substrate, comprising:

a gate pad configured to be bonded to a gate driving integrated circuit;

a data pad configured to be bonded to a data driving integrated circuit;

a plurality of connecting lines configured to transmit signals between a gate driving integrated circuit bonded to the gate pad and a data driving integrated circuit bonded to the data pad;

a testing pad; and a plurality of first testing pads.

16. The array substrate of claim 15, further comprising:

a plurality of additional pads between the data pad and the gate pad; and a plurality of additional lines configured to transmit signals between adjacent additional pads.

* * * * *